(12) United States Patent
Calver et al.

(10) Patent No.: US 12,028,994 B2
(45) Date of Patent: Jul. 2, 2024

(54) PROTECTION SYSTEM

(71) Applicant: BRITISH TELECOMMUNICATIONS PUBLIC LIMITED COMPANY, London (GB)

(72) Inventors: Daniel Calver, London (GB); Martin Nottage, London (GB)

(73) Assignee: BRITISH TELECOMMUNICATIONS public limited company, London (GB)

( * ) Notice: Subject to any disclaimer, the term of this patent is extended or adjusted under 35 U.S.C. 154(b) by 246 days.

(21) Appl. No.: 17/764,792

(22) PCT Filed: Aug. 13, 2020

(86) PCT No.: PCT/EP2020/072823
§ 371 (c)(1),
(2) Date: Mar. 29, 2022

(87) PCT Pub. No.: WO2021/063582
PCT Pub. Date: Apr. 8, 2021

(65) Prior Publication Data
US 2022/0361345 A1    Nov. 10, 2022

(30) Foreign Application Priority Data
Sep. 30, 2019    (GB) ..................... 1914080

(51) Int. Cl.
*H05K 5/02* (2006.01)
*H02H 5/08* (2006.01)
*H04Q 1/02* (2006.01)

(52) U.S. Cl.
CPC ........... *H05K 5/0212* (2022.08); *H02H 5/083* (2013.01); *H04Q 1/114* (2013.01); *H05K 5/0213* (2013.01)

(58) Field of Classification Search
CPC .... H05K 5/0212; H05K 5/0213; H04Q 1/114; H04Q 1/025; H02H 5/083
(Continued)

(56) References Cited

U.S. PATENT DOCUMENTS 5,925,848 A * 7/1999 Elliott, Jr. ................ H02G 9/10
174/50
6,513,342 B1    2/2003 Flynn
(Continued)

FOREIGN PATENT DOCUMENTS

CN    109026634    12/2018
CN    110485761    11/2019
(Continued)

OTHER PUBLICATIONS

Machine translation of Sung Korean Patent Document KR 1884288 B1 Aug. 2018 (Year: 2018).*
(Continued)

*Primary Examiner* — Kevin J Comber
(74) *Attorney, Agent, or Firm* — Nixon & Vanderhye P.C.

(57) ABSTRACT

A telecommunications cabinet (100) for enclosing telecommunications equipment (110) of a telecommunications network, the telecommunications cabinet comprising: an electric water pump (140); a water detector (160), wherein the water detector is configured to cause activation of the electric water pump upon detecting water; a power supply (150) for powering the electric water pump; and a fluid conduit (170), coupled to the electric water pump, extending from within the cabinet to an outside of the cabinet via an aperture (180) in the cabinet so as to convey water out of the cabinet.

24 Claims, 2 Drawing Sheets

Figure 1:
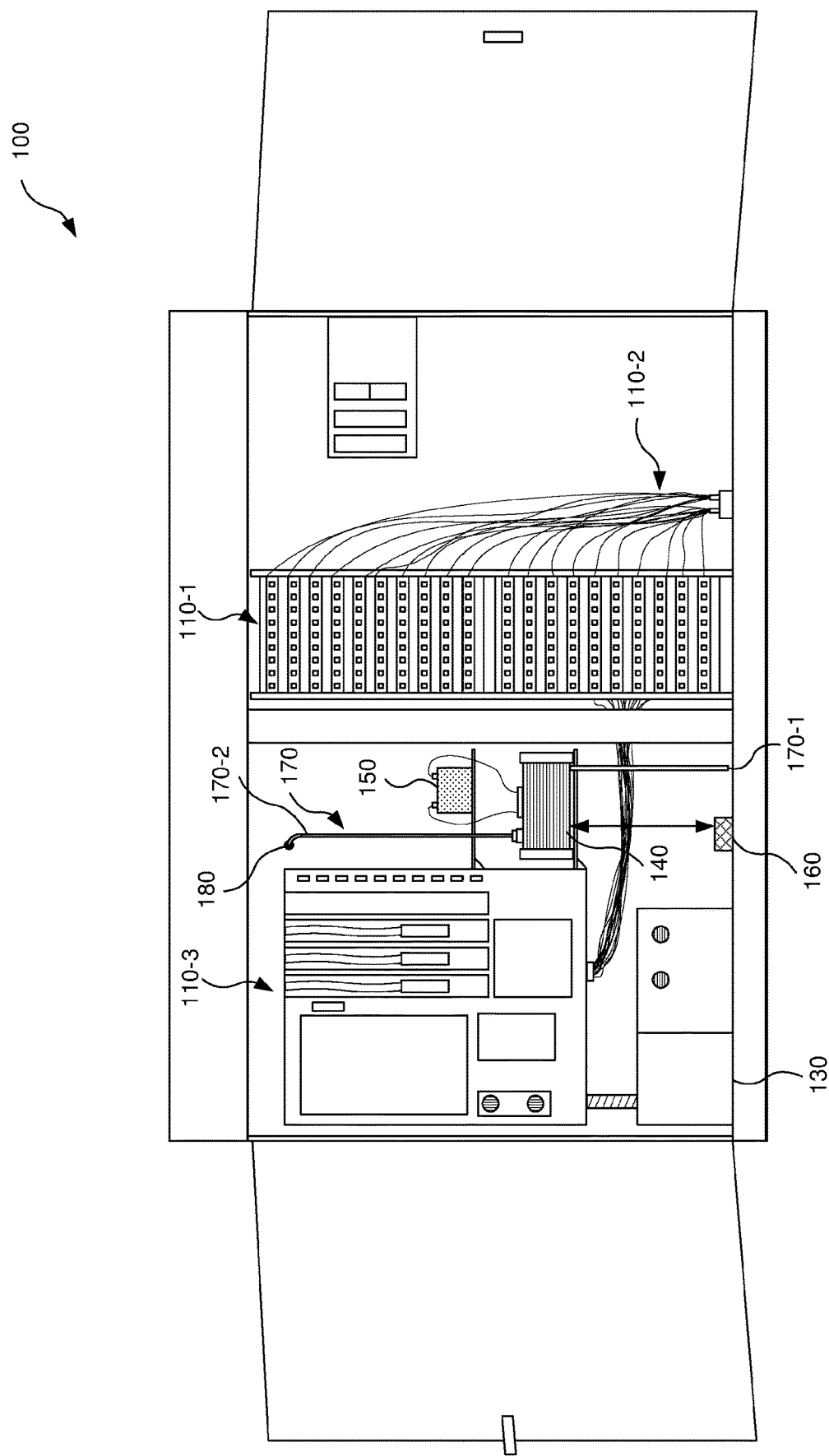

(58) Field of Classification Search
USPC .......................................................... 361/59
See application file for complete search history.

(56) References Cited

U.S. PATENT DOCUMENTS

| | | | |
|---|---|---|---|
| 6,617,973 B1 * | 9/2003 | Osterman | G08B 21/20 |
| | | | 429/96 |
| 7,149,546 B1 | 12/2006 | Hollen | |
| 7,513,385 B2 | 4/2009 | Flynn | |
| 8,275,417 B2 | 9/2012 | Flynn | |
| 2005/0145631 A1 | 7/2005 | Flynn | |
| 2010/0303654 A1 * | 12/2010 | Petersen | F04B 35/06 |
| | | | 417/423.7 |
| 2012/0298330 A1 | 11/2012 | Mysse, III | |
| 2014/0069826 A1 | 3/2014 | Vijayakumar | |

FOREIGN PATENT DOCUMENTS

| | | | | |
|---|---|---|---|---|
| ES | 2306631 | | 11/2008 | |
| ES | 2306631 A1 * | | 11/2008 | |
| GB | 2570111 | | 7/2019 | |
| GB | 2570111 A * | | 7/2019 | B05B 1/14 |
| JP | 2017139254 | | 8/2017 | |
| KR | 660089 B1 * | | 12/2006 | |
| KR | 1884288 B1 * | | 8/2018 | H01F 27/02 |

OTHER PUBLICATIONS

Machine translation of Kang et al. Korean Patent Document KR 660089 B1 Dec. 2006 (Year: 2006).*
Machine translation of Gomez et al. Spanish Patent Document ES 2306631 A1 Nov. 2008 (Year: 2008).*
International Preliminary Report on Patentability for PCT/EP2020/072823 dated Apr. 14, 2022 (14 pages).
Examination Report for GB1914080.5, dated Dec. 21, 2021 (4 pages).
GB Search and Examination Report for GB1914080.5, dated Mar. 31, 2020 (7 pages).
International Search Report and Written Opinion of the International Searching Authority for PCT/EP2020/072823 dated Nov. 4, 2020 (18 Pages).
"Underground Distribution Substation. Vault design, packaging and procurement services" ABB. SAS-004-03 Distribution Automation Systems. Accessd Mar. 29, 2022, from https://library.e.abb.com/public/f7f3ed1837a04137a5f7b19d8228d9ec/FINALFACTSHEET_SAS00403_VaultDesignPackaging_4CAE000442_171113WEB.pdf (2 pages).

* cited by examiner

PROTECTION SYSTEM

This application is the U.S. national phase of International Application No. PCT/EP2020/072823 filed Aug. 13, 2020 which designated the U.S. and claims priority to GB 1914080.5 filed Sep. 30, 2019, the entire contents of each of which are hereby incorporated by reference.

FIELD OF INVENTION

The present invention relates to a telecommunications cabinet and to a kit of parts for mitigating water damage to telecommunications equipment.

BACKGROUND

Telecommunications cabinets are an essential part of telecommunications networks, providing easily-accessible junctures of the network, and may contain within them a plurality of individual twisted pair cables of a local loop and multiplexers (such as Digital Subscriber Line Access Multiplexer) for connecting the twisted pair cables to a main distribution frame.

The telecommunications cabinets are typically located outdoors, and as such they are exposed to the elements. The telecommunications cabinets are typically fairly rudimentary, providing only a shell for protecting the telecommunications equipment from vandalism and unexceptional environmental conditions. However, such cabinets are not typically arranged to protect telecommunications equipment from more severe environmental conditions, and in particular flooding and torrential rain, which may cause damage to the telecommunications equipment within the cabinet, and in turn cause network downtime.

It is therefore an aim of the present invention to at least alleviate the aforementioned problem or its problematic effects.

STATEMENTS OF INVENTION

According to a first aspect of the present invention, there is provided a telecommunications cabinet for enclosing telecommunications equipment of a telecommunications network, the telecommunications cabinet comprising: an electric water pump; a water detector, wherein the water detector is configured to cause activation of the electric water pump upon detecting water; a power supply for powering the electric water pump; and a fluid conduit, coupled to the electric water pump, extending from within the cabinet to an outside of the cabinet via an aperture in the cabinet so as to convey water out of the cabinet.

Preferably, the electric water pump is arranged within the telecommunications cabinet, and more preferably, entirely within the telecommunications cabinet.

Optionally, the electric water pump is arranged proximate a floor of the telecommunications cabinet, and more preferably on the floor of the telecommunications cabinet, and still more preferably at the lowest point of the telecommunications cabinet. Optionally, "proximate a floor" connotes resting upon a floor. Optionally, the electric water pump is arranged below the floor of the telecommunications cabinet, and for example within a borehole through which cables (telecommunication and/or power) are fed to the cabinet.

Optionally, the electric water pump is supported at an elevated position above the floor of the telecommunications cabinet. Preferably, the water pump is supported proximate a top of the telecommunications cabinet, and more preferably at the highest point of the telecommunications cabinet.

Preferably, the electric water pump is engaged to the cabinet and/or telecommunications equipment by means of a coupling. Preferably, the electric water pump is suspended from the telecommunications cabinet and/or mounted to a wall or shelf of the cabinet and/or telecommunications equipment.

Preferably, the power supply, the water detector and/or the electric water pump is/are arranged so as to weigh down the telecommunications equipment. In this way, the additional weight of the power supply, the water detector and/or the electric water pump may help reduce buoyancy of the telecommunications equipment. More preferably the power supply, water detector and/or electric water pump is/are coupled to and/or engaged to the telecommunications equipment.

The telecommunications equipment may include: a multiplexer, such as a Digital Subscriber Line Access Multiplexer; a rack for line cards; and/or a copper pair terminal block.

Preferably, the telecommunications cabinet further comprises an engagement formation for engaging the conduit to the aperture. Optionally, the engagement formation is a friction fit member or a clamp.

Preferably, the engagement formation comprises a seal for sealing the aperture between the cabinet and the conduit, thereby to help prevent water ingress into the cabinet. Optionally, the conduit extends at least in part upwards and above the electric water pump and/or at least in part downwards and below the electric water pump.

Preferably, the conduit comprises an inversion where it extends outside of the cabinet, thereby to help prevent water ingress into the cabinet. The inversion may be 'u-shaped'.

Preferably, the telecommunications cabinet further comprises a ventilation aperture and a seal for sealing the ventilation aperture so as to help prevent water ingress into the cabinet via the ventilation aperture. Preferably, the seal is removable. Preferably, the seal is in the form of a membrane or plug. Preferably, the seal comprises an engagement for engaging with the telecommunication cabinet, and more preferably the engagement is in the form of: a friction fitment, adhesive; and/or magnetic coupling. Preferably, the seal is waterproof. Preferably, the seal is formed of plastic or rubber. Preferably, the telecommunications cabinet comprises a plurality of seals, each seal for sealing a plurality of vents of the telecommunications cabinet. Preferably, the seal is arranged to seal at least one, but not all, ventilation apertures of the cabinet, thereby to limit—rather than prevent entirely—a flow of water into the cabinet. Preferably, the seal is arranged to seal a lowermost vent of the telecommunications cabinet. Preferably, at least one ventilation aperture of the telecommunications cabinet is unsealed. Preferably, the aperture is a ventilation aperture of the cabinet. Preferably, said "ventilation aperture" herein connotes a structure having been intended to function as a ventilation hole prior to fitment of the conduit into the ventilation hole.

Optionally, the power supply is further configured to power the water detector. Optionally, the power supply is a battery.

Preferably, the telecommunications cabinet further comprises a further power supply for powering the telecommunications equipment, and wherein the water detector and/or the water pump are in (electrical) communication with said further power supply, wherein the water detector and/or the water pump are configured to deactivate the further power supply upon activation of the water detector and/or the water pump.

Preferably, the water pump, the water detector and/or the power supply are (or are available to be) powered by the further power supply (instead of, or in addition to, the power supply). Optionally, the further power supply is a mains power supply.

Preferably, the telecommunications cabinet further comprises an electrical adaptor for adapting the electrical output of the further power supply so that the electrical output/s is/are compatible for powering the water pump, the water detector and/or the power supply.

Preferably, the telecommunications cabinet further comprises a controller, wherein the controller is in communication with: the water pump; the water detector; the power supply; and the telecommunications equipment; wherein the controller is configured to cause transmission of an alert to a (optionally, predefined) network location via the telecommunications equipment in dependence upon an input from the water pump, the water detector and/or the power supply.

Preferably, the input is: activation and/or deactivation of the water pump and/or the water detector; a fault with the water pump, the water detector and/or the power supply; and/or depletion of the power supply. Preferably, the (optionally, predefined) network location is an operator of the telecommunications network associated with the telecommunications equipment.

Preferably, the power supply is further electronically coupled to the telecommunications equipment so as to power the telecommunications equipment, and more preferably in the event of a failure or deactivation of the further power supply.

Preferably, the telecommunications cabinet further comprises a circuit breaker for the further power supply, and wherein the water detector is connected to the circuit breaker so as to activate the circuit breaker thereby to cease supply of power to the telecommunications equipment in response to the water detector detecting water.

Preferably, the water detector is in the form of an electrical and/or mechanical water detector, and optionally is a float switch. Preferably, the water detector is in mechanical and/or electrical contact with the water pump so as to activate the water pump.

Preferably, the telecommunications cabinet is situated above ground. Preferably the floor of the telecommunications cabinet is at or above ground level. Preferably, the telecommunications cabinet is arranged such that the telecommunications equipment is at and/or above ground level.

Preferably, the telecommunications cabinet is situated outdoors, and preferably the telecommunications cabinet is unsheltered.

According to another aspect of the invention, there is provided a kit of parts for retrofitting to a telecommunications cabinet, the telecommunications cabinet telecommunications equipment of a telecommunications network, the kit of parts comprising: an electric water pump; a water detector; a power supply for powering the electric water pump; an electrical connector for connecting the electric water pump to the water detector so as to cause activation of the electric water pump upon detecting water and for connecting the electric water pump to the power supply so as to power the electric water pump; and a fluid conduit for coupling to the electric water pump and for extending from within the cabinet to an outside of the cabinet via an aperture in the cabinet so as to convey water out of the cabinet.

The invention includes any novel aspects described and/or illustrated herein. The invention also extends to methods and/or apparatus substantially as herein described and/or as illustrated with reference to the accompanying drawings. The invention is also provided as a computer program and/or a computer program product for carrying out any of the methods described herein and/or for embodying any of the apparatus features described herein, and a computer-readable medium storing thereon a program for carrying out any of the methods and/or for embodying any of the apparatus features described herein. Features described as being implemented in hardware may alternatively be implemented in software, and vice versa.

The invention also provides a method of transmitting a signal, and a computer product having an operating system that supports a computer program for performing any of the methods described herein and/or for embodying any of the apparatus features described herein.

Any apparatus feature may also be provided as a corresponding step of a method, and vice versa. As used herein, means plus function features may alternatively be expressed in terms of their corresponding structure, for example as a suitably-programmed processor.

Any feature in one aspect of the invention may be applied, in any appropriate combination, to other aspects of the invention. Any, some and/or all features in one aspect can be applied to any, some and/or all features in any other aspect, in any appropriate combination. Particular combinations of the various features described and defined in any aspects of the invention can be implemented and/or supplied and/or used independently.

As used throughout, the word 'or' can be interpreted in the exclusive and/or inclusive sense, unless otherwise specified.

Figure 2:
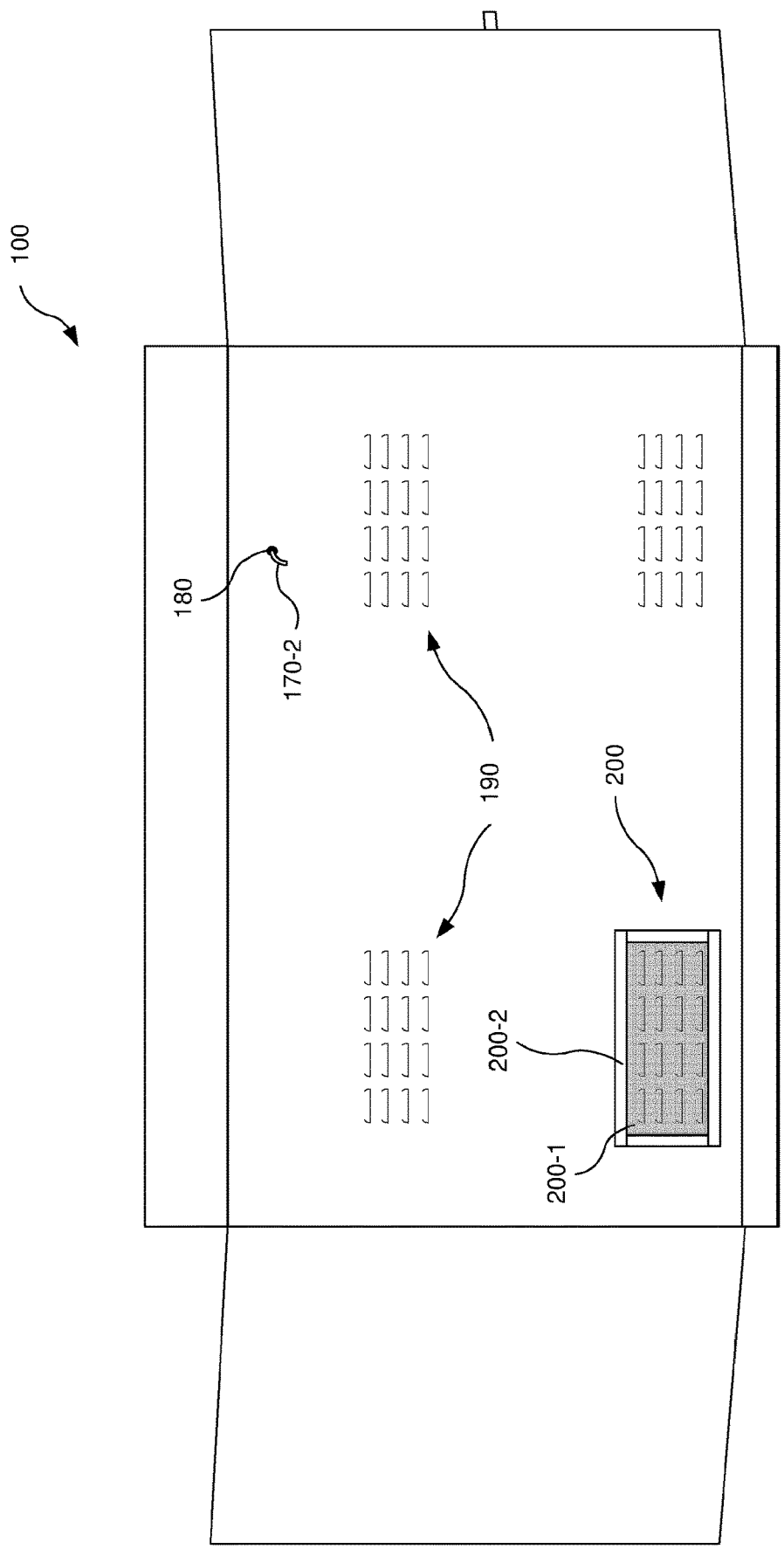

The invention extends to a telecommunications cabinet and kit of parts as described herein and/or substantially as illustrated in the accompanying drawings. The present invention is now described, purely by way of example, with reference to the accompanying diagrammatic drawings, in which:

FIGS. 1 and 2 show a telecommunications cabinet incorporating a water protection system.

SPECIFIC DESCRIPTION

FIGS. 1 and 2 show a telecommunications outside plant in the form of a telecommunications cabinet 100. The cabinet encloses telecommunications equipment 110 that forms part of a telecommunications network.

The telecommunications equipment 110 enclosed within the cabinet includes: insulation displacement contact (IDC) block for twisted pair cables 110-1; fibre optic cables 110-2; and a Digital Subscriber Line Access Multiplexer (DSLAM) 110-3. The cabinet further encloses a power supply 130 for supplying power to, at least, the DSLAM 110-3.

The cabinet shown in FIGS. 1 and 2 is typically situated outdoors, and therefore exposed to adverse weather conditions, including flooding (such as from heavy rain or melting snow).

However, the cabinet is unsealed such that water on the ground that is above a certain depth may enter the cabinet. It is advantageous, and may even be necessary, for the cabinet not to be fluid-tight, to allow ventilation for the electronics within the cabinet and so that the cabinet is not buoyant (which may cause uplift of the cabinet, in turn dislocating cables or electrical equipment, and therefore causing network downtime).

Accordingly, the cabinet 100 is provided with a water protection system, which in turn comprises: a water pump 140 that is electrically-powered by means of a power supply, in the form of a battery 150, connected thereto; a water detector 160; and a conduit system 170 for evacuating water out of the cabinet.

The water detector 160 is configured to detect water ingress into the cabinet, and it is coupled to the water pump 140 so as to trigger activation of the water pump upon detecting a presence of water within the cabinet, and in particular upon detecting water within the cabinet above a threshold depth.

The water detector 160 is in the form of a mechanical (e.g. a float or displacement switch) or electronic (e.g. a capacitive or conductivity sensor) water detector.

So as provide an early indication of flooding within the cabinet, the water detector 160 is provided on or proximate to a floor of the cabinet.

Where the water detector operates mechanically, the water detector is mechanically coupled to the water pump (e.g. by means of a push rod, not shown) so as to actuate an electronic switch (also not shown) provided as part of the water pump.

When the water detector operates electronically, the water detector is electronically coupled to the water pump (e.g. by means of electrical wiring, not shown) so as to activate the water pump. In the example where the water detector 160 is actively-powered, it is also electrically coupled to the battery 150 from which it sources power.

The water detector 160 is further configured so as to deactivate the water pump upon detecting an absence of water within the cabinet, and in particular upon detecting water within the cabinet below the threshold depth.

To prevent displacement of the water detector 160 by floodwater, the water pump 140 is weighted or fixed to the cabinet or a part thereof.

The water pump 140 is coupled to a conduit system 170 so as to pump water through the conduit system. A first conduit 170-1 is connected to a fluid input of the water pump, and the first conduit is arranged on or proximate to a floor of the cabinet.

A second conduit 170-1 is connected to a fluid output of the water pump 140, and the second conduit extends to an elevated position above the first conduit and the water pump, and proximate the top of the cabinet, thereby to help ensure that water is evacuated above a flood level.

The conduit system 170 comprises tubing suitable for transporting water at relatively low-pressures, and is most-appropriately formed of plastic.

A through-hole 180 is provided in the wall of the cabinet through which the second conduit 170-2 passes thereby to allow evacuation of water from within the cabinet to an outside of the cabinet. The second conduit is secured to the cabinet around the through-hole, for example, by means of a friction fit or clamp member, and any gaps between the through-hole and the second conduit are sealed to as to prevent ingress of rain water. As best shown in FIG. 2, the second conduit termites outside of the cabinet, beyond the through-hole, with an inversion, thereby to prevent flow of water into the cabinet via the second conduit.

In the example of FIG. 1, the water pump is shown elevated from the floor of the cabinet; this arrangement may assist with protecting the water pump and its electricals from damage owing to floodwater, where the water pump and its electronics are not submersible.

In the example of FIG. 1, the water pump is arranged so as to weigh-down the DSLAM 110-3 by resting (or securing) the water pump to a shelf that is coupled to the DSLAM 110-3; in this way, the buoyancy of the DLSAM is reduced by the weight of water pump.

In one example, the water pump is capable of pumping at least 250 litres per hour (l/hr), 1,000 l/hr, 2,000 l/hr, 3,000 l/hr or 5,000 l/hr. In one example, the water pump is powered at up to 2.5 Volts (V), 6V or 12V.

The battery 150 is provided within the cabinet at an elevated position so as prevent damage from floodwater.

As with the water pump, the battery is also arranged to weigh-down the DSLAM 110-3 by resting (or securing) the battery to a shelf that is coupled to the DSLAM 110-3, thereby to help reduce its buoyancy.

In one example, the battery and its electrical connections are configured to an IP68 rating with a marine fuse. In one example, the battery is rated to at least 10 Amp-hours (Ah), at least 15 Ah or at least 20 Ah. In one example, the battery is a lead-acid battery.

In one example, the battery is electrically coupled to the power supply 130, in this way the battery is capable of being charged by the power supply, thereby reducing maintenance costs. Where the battery is configured to be charged by the power supply, the battery is provided with a suitable adaptor to convert the electrical supply from the power supply 130.

As best shown in FIG. 2 (and omitted from FIG. 1 for conciseness), the telecommunications cabinet 100 is provided with a plurality of vent holes 190 to permit escape of heat. However, the vent holes may allow significant ingress of water into the cabinet owing to the size of these apertures.

In order to reduce the ingress of water into the cabinet, the telecommunications cabinet 100 is provided with a sealing member 200 for providing a waterproof seal over the vent holes 190, thereby to prevent weather ingress via such sealed vent holes.

In the example shown in FIG. 2, the sealing member 200 comprises a waterproof membrane 200-1 for covering the vent holes 190 and a watertight coupling 200-2 for coupling the waterproof membrane to the telecommunications cabinet 100 and for forming a seal with the telecommunications cabinet. In particular, the waterproof membrane 200-1 is in the form of a plastic sheet (shown as being transparent in FIG. 2), and the watertight coupling 200-2 is in the form of waterproof adhesive strips, a magnetic coupling or electrostatic coupling. So as to form a seal, the watertight coupling 200-2 is provided around the entire perimeter of the waterproof membrane 200-1.

However, whilst it is desirable to prevent any ingress of water into the telecommunications cabinet by entirely sealing the cabinet, doing so may result in the cabinet reaching an unacceptable temperature and may also increase the buoyancy of the cabinet such that it damages the seating of the cabinet in the ground or entirely lifts the cabinet. Accordingly, the sealing member 200 is used only to cover a portion of the vent holes 190 that are expected to experience flooding; in this way, partial sealing of the vents limits, but does not entirely prevent, water flow into the cabinet.

When floods are expected, the sealing members are installed as part of the cabinet by adhering the waterproof membrane 200-1 on the cabinet by means of the watertight coupling 200-2.

The watertight coupling 200-2 is a removable coupling, thereby enabling the waterproof membrane 200-1 to be removed once floods have subsided.

In one example, the water detector 160 is coupled to power supply 130 so as to trip the power supply 130 upon detecting water within the cabinet; this safety features helps reduce the risk of electrocution and of damage to the power supply or the telecommunications equipment 110. Upon the water detector 160 detecting the absence of water, the water detector 160 is configured to re-activate the power supply. In order to perform such deactivation and activation of the power supply, the water detector is electrically coupled to a controller (not shown) of the power supply or is physically coupled to actuate an on-off switch of the power supply.

In one example, the water detector 160 is coupled to the telecommunications equipment 110. Upon detecting water within the cabinet the water detector, via a suitable processor, is arranged to cause transmission via the telecommunications equipment 110 to a control centre to issue an alert that water has been detected in the cabinet. This may assist with flood warnings and with maintenance of the cabinet.

Furthermore, the water pump and/or battery is/are also available to be connected to the telecommunications equipment thereby to send to the control centre information regarding the performance of the water pump and/or battery, which again may assist with maintenance of the cabinet.

In one example, the cabinet 100 is a Huawei® 96, H100 128 or 288 cabinet, an ECI Telecom® 128 or 256 cabinet or a PCP 5-, 6- or 7-type cabinet.

Alternatives and Modifications

In an alternative example, the water detector is integrally provided as part of the water pump . . . .

In one example, the first conduit 170-1 is weighted or coupled to a fixed member within the cabinet and/or to the telecommunications equipment 110 to prevent uplift by floodwater.

In an alternative, the water pump 140 and/or water detector 160 is/are powered directly by the power supply 130, rather than by battery 150. In this example, the water pump 140 and/or water detector 160 is/are provided with a suitable adaptor to convert the electrical supply from the power supply 130.

In an alternative example, the water pump is provided as a submersible water pump; this allows the water pump to be located lower within the cabinet, and the water pump is available to be located on the floor of the cabinet, thereby allowing the pump to be substantially co-located with the water detector. In this example, the first conduit 170-1 is optional (or forms part of the water pump).

Each feature disclosed in the description, and (where appropriate) the claims and drawings may be provided independently or in any appropriate combination.

Reference numerals appearing in the claims are by way of illustration only and shall have no limiting effect on the scope of the claims.

The invention claimed is:

1. A telecommunications cabinet for enclosing telecommunications equipment of a telecommunications network, the telecommunications cabinet comprising:
an electric water pump;
a water detector, wherein the water detector is configured to cause activation of the electric water pump upon detecting water;
a power supply for powering the electric water pump; and
a fluid conduit, coupled to the electric water pump, extending from within the cabinet to an outside of the cabinet via an aperture in the cabinet so as to convey water out of the cabinet;
wherein the power supply, the water detector and/or the electric water pump are/is arranged so as to weigh down the telecommunications equipment when said equipment is enclosed within the telecommunications cabinet.

2. A telecommunications cabinet according to claim 1, wherein the electric water pump is arranged within the telecommunications cabinet.

3. A telecommunications cabinet according to claim 1, wherein the electric water pump is arranged proximate a floor of the telecommunications cabinet.

4. A telecommunications cabinet according to claim 1, wherein the electric water pump is supported at an elevated position above the floor of the telecommunications cabinet.

5. A telecommunications cabinet according to claim 1, wherein the electric water pump is engaged to the cabinet and/or the telecommunications equipment by means of a coupling.

6. A telecommunications cabinet according to claim 1, wherein the water pump is configured to pump at least 250 litres per hour.

7. A telecommunications cabinet according to claim 1, further comprising an engagement formation for engaging the conduit to the aperture.

8. A telecommunications cabinet according to claim 7, wherein the engagement formation comprises a seal for sealing the aperture between the cabinet and the conduit, thereby to help prevent water ingress into the cabinet.

9. A telecommunications cabinet according to claim 1, wherein the conduit comprises an inversion where the conduit extends outside of the cabinet, thereby to help prevent water ingress into the cabinet.

10. A telecommunications cabinet according to claim 1, wherein the telecommunications cabinet further comprises a ventilation aperture and a seal for sealing the ventilation aperture so as to help prevent water ingress into the cabinet via the ventilation aperture.

11. A telecommunications cabinet according to claim 10, wherein the seal is arranged to seal a lowermost vent of the telecommunications cabinet.

12. A telecommunications cabinet according to claim 10, wherein at least one ventilation aperture of the telecommunications cabinet is unsealed.

13. A telecommunications cabinet according to claim 1, wherein the aperture is a ventilation aperture of the cabinet.

14. A telecommunications cabinet according to claim 1, wherein the telecommunications cabinet further comprises a further power supply for powering the telecommunications equipment, wherein the water detector and/or the water pump are in communication with said further power supply, and wherein the water detector and/or the water pump are configured to deactivate the further power supply upon activation of the water detector and/or the water pump.

15. A telecommunications cabinet according to claim 14, further comprising a circuit breaker for the further power supply, and wherein the water detector is connected to the circuit breaker so as to activate the circuit breaker thereby to cease a supply of power to the telecommunications equipment from the further power supply in response to the water detector detecting water.

16. A telecommunications cabinet according to claim 1, wherein the telecommunications cabinet further comprises a further power supply for powering the telecommunications equipment, wherein the water pump, the water detector and/or the power supply are powered by the further power supply.

17. A telecommunications cabinet according to claim 16, wherein the telecommunications cabinet further comprises an electrical adaptor for adapting the electrical output of the further power supply so that the electrical output is compatible for powering the water pump, the water detector and/or the power supply.

18. A telecommunications cabinet according to claim 1, further comprising a controller, wherein the controller is in communication with: the water pump; water detector; power supply; and the telecommunications equipment; wherein the controller is configured to cause transmission of an alert to a predefined network location via the telecommunications equipment in dependence upon an input from the water pump, water detector and/or power supply.

19. A telecommunications cabinet according to claim 1, wherein the power supply is further electronically coupled to the telecommunications equipment so as to power the telecommunications equipment.

20. A telecommunications cabinet according to claim 1, wherein the water detector is in the form of an electrical water detector or a float switch.

21. A telecommunications cabinet according to claim 1, wherein the telecommunications cabinet is situated above ground.

22. A telecommunications cabinet according to claim 1, wherein the telecommunications cabinet is situated outdoors.

23. The telecommunications cabinet according to claim 1, wherein:
a shelf is coupled to the telecommunications equipment; and
wherein the electric water pump rests on the shelf to weigh down the telecommunications equipment when the telecommunications equipment is enclosed within the telecommunications cabinet.

24. The telecommunications cabinet according to claim 1, wherein:
a shelf is coupled to the telecommunications equipment; and
wherein the power supply rests on the shelf to weigh down the telecommunications equipment when the telecommunications equipment is enclosed within the telecommunications cabinet.

\* \* \* \* \*